United States Patent
Honkote et al.

(10) Patent No.: US 10,451,675 B2
(45) Date of Patent: Oct. 22, 2019

(54) $V_{MIN}$ RETENTION DETECTOR APPARATUS AND METHOD (71) Applicant: Intel Corporation, Santa Clara, CA (US)

(72) Inventors: Vinayak Honkote, Bangalore (IN); Sriram R. Vangal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/011,356

(22) Filed: Jun. 18, 2018

(65) Prior Publication Data
US 2018/0299506 A1    Oct. 18, 2018

Related U.S. Application Data (62) Division of application No. 15/072,280, filed on Mar. 16, 2016, now Pat. No. 10,018,674.

(51) Int. Cl.
| | | |
|---|---|---|
| *G01R 31/3173* | (2006.01) | |
| *G06F 1/3206* | (2019.01) | |
| *G06F 1/28* | (2006.01) | |
| *G06F 1/30* | (2006.01) | |
| *G06F 1/3296* | (2019.01) | |
| *G01R 31/317* | (2006.01) | |
| *G06F 1/26* | (2006.01) | |

(52) U.S. Cl.
CPC ... *G01R 31/3173* (2013.01); *G01R 31/31703* (2013.01); *G01R 31/31727* (2013.01); *G06F 1/26* (2013.01); *G06F 1/28* (2013.01); *G06F 1/305* (2013.01); *G06F 1/3206* (2013.01); *G06F 1/3296* (2013.01); *Y02D 10/172* (2018.01)

(58) Field of Classification Search
CPC .......... G01R 31/3173; G01R 31/31727; G01R 31/31703; G06F 1/26; G06F 1/3206
See application file for complete search history.

(56) References Cited

U.S. PATENT DOCUMENTS

| | | | |
|---|---|---|---|
| 2004/0239367 A1* | 12/2004 | Elappuparackal | G06F 1/04 326/46 |
| 2005/0025275 A1 | 2/2005 | Hsiao | |
| 2010/0264837 A1 | 10/2010 | Zhao | |
| 2011/0012643 A1 | 1/2011 | Jain et al. | |
| 2012/0112785 A1* | 5/2012 | Mizoguchi | G01R 19/16542 324/762.08 |
| 2012/0127214 A1 | 5/2012 | Han et al. | |
| 2012/0154680 A1 | 6/2012 | Wu et al. | |
| 2015/0002217 A1 | 1/2015 | Graf et al. | |

(Continued)

OTHER PUBLICATIONS

Non-Final Office Action dated Sep. 15, 2017 for U.S. Appl. No. 15/072,280.

(Continued)

*Primary Examiner* — Thien Nguyen
(74) *Attorney, Agent, or Firm* — Green, Howard & Mughal LLP (57) ABSTRACT

Described is an apparatus which comprises: a state detector which is operable to detect logic states of zero and one in response to a clock edge; and an error detector coupled to the state detector, wherein the error detector is to detect an error in the detected logic states.

20 Claims, 9 Drawing Sheets

(56) References Cited

U.S. PATENT DOCUMENTS

2016/0034103 A1* 2/2016 Yoshikawa ............... G06F 1/16
                                                   345/174
2017/0212972 A1* 7/2017 Pillay .................. G06F 17/5009

OTHER PUBLICATIONS

Notice of Allowance from U.S. Appl. No. 15/072,280 notified Mar. 13, 2018, 11 pgs.
Restriction Requirement dated Jun. 20, 2017 for U.S. Appl. No. 15/072,280.
Tschanz, J. et al., "Tunable replica circuits and adaptive voltage-frequency techniques for dynamic voltage, temperature, and aging variation tolerance", Published in: 2009 Symposium on VLSI Circuits, Date of Conference: Jun. 16-18, 2009, Kyoto, Japan.

* cited by examiner

$V_{MIN}$ RETENTION DETECTOR APPARATUS AND METHOD

CLAIM FOR PRIORITY

This application is a divisional of U.S. patent application Ser. No. 15/072,280, filed on Mar. 16, 2016, entitled "$V_{MIN}$ RETENTION DETECTOR APPARATUS AND METHOD," which is incorporated by reference in its entirety.

BACKGROUND

Supply voltage ($V_{cc}$) scaling is the most effective technique for reducing energy consumption of digital integrated circuits. As $V_{cc}$ reduces, the adverse impact of process parameter variations on silicon performance and reliable operation increases. In addition, today's silicon execute over a wide dynamic operational range ($V_{cc}$, Frequency, temperature, etc.). Device reliability, including logic data retention concerns are most pronounced in the lowest-power modes and at the minimum supply voltages ($V_{min}$). $V_{min}$ is the minimum operating voltage below which circuits (e.g., sequential units) no longer operate correctly (e.g., the state held in the sequential unit flips).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Detecting data retention $V_{min}$ floor is helpful since low-voltage integrated circuits could be operating at very low frequencies where retention $V_{min}$ could be the limiter. By detecting the data retention $V_{min}$ floor, the lowest achievable $V_{min}$ supply voltage is determined. Retention $V_{min}$ is strongly dependent on temperature, aging, and other dynamic variations and thus it may be desirable to have a way to sense and track the actual retention $V_{min}$ on silicon.

Various embodiments describe an in-situ, symmetric, logic $V_{min}$ retention voltage detection (RVD) circuit for sequential units. Here, $V_{min}$ refers to the minimum operational voltage for a logic below which the logic, sequential, and/or other circuits (e.g., memory) do not retain saved data. For example, at a supply voltage below $V_{min}$, the sequential units flip their output data or the memory loses its saved data. Knowledge and in-situ tracking of the lowest achievable (yet operationally safe) logic $V_{min}$ floor, in the presence of process variations, is an important factor to maximizing $V_{cc}$ (power supply) guard bands and achievable energy efficiency. Various embodiments provide such in-situ tracking and knowledge.

In some embodiments, the RVD circuit uses dual, independent logic 1 or logic 0 sequential units for checking data retention $V_{min}$ floor. In some embodiments, the RVD circuit is implemented with devices to track within-die (WID) variations. For example, the RVD circuit is implemented with minimum sized (e.g., smallest width (W) and length (L)) and higher $V_T$ (threshold) devices to safely predict data retention failure before it actually occurs in the design. In some embodiments, the devices used in the RVD circuit are one digital grid (1DG) devices (e.g., devices formed on the shortest allowable drawing grid by the process technology node). In some embodiments, the devices used in the RVD circuit are two digital grid (2DG) devices (e.g., devices formed on the second from the shortest allowable drawing grid by the process technology node). In some embodiments, the RVD circuit has a tunable load to adjust $V_{min}$, post-fabrication.

In some embodiments, the RVD circuit is integrated as part of the dynamic voltage and frequency scaling (DVFS) loop of the processor with the on-die power management unit (PMU). DVFS loop is a feedback loop which is used by the PMU to dynamically (e.g., automatically) reduce frequency and supply voltage to one or more portions of the processor to reach a certain power envelop. In some embodiments, multiple instances of the RVD circuits are instantiated on the chip to track RVD errors and adjust for WID variations.

There are many technical effects of the various embodiments. For example, the RVD circuits of some embodiments dynamically predict approaching $V_{min}$ floor, and this prediction is used to determine the $V_{min}$ level for operating conditions (e.g., temperature, WID, frequency, etc.) of the integrated circuit. In some embodiments, a guard band is established for $V_{min}$ by the RVD circuits. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. Here, p-type transistor is labeled as MP while n-type transistor is labeled as MN.

Figure 1:
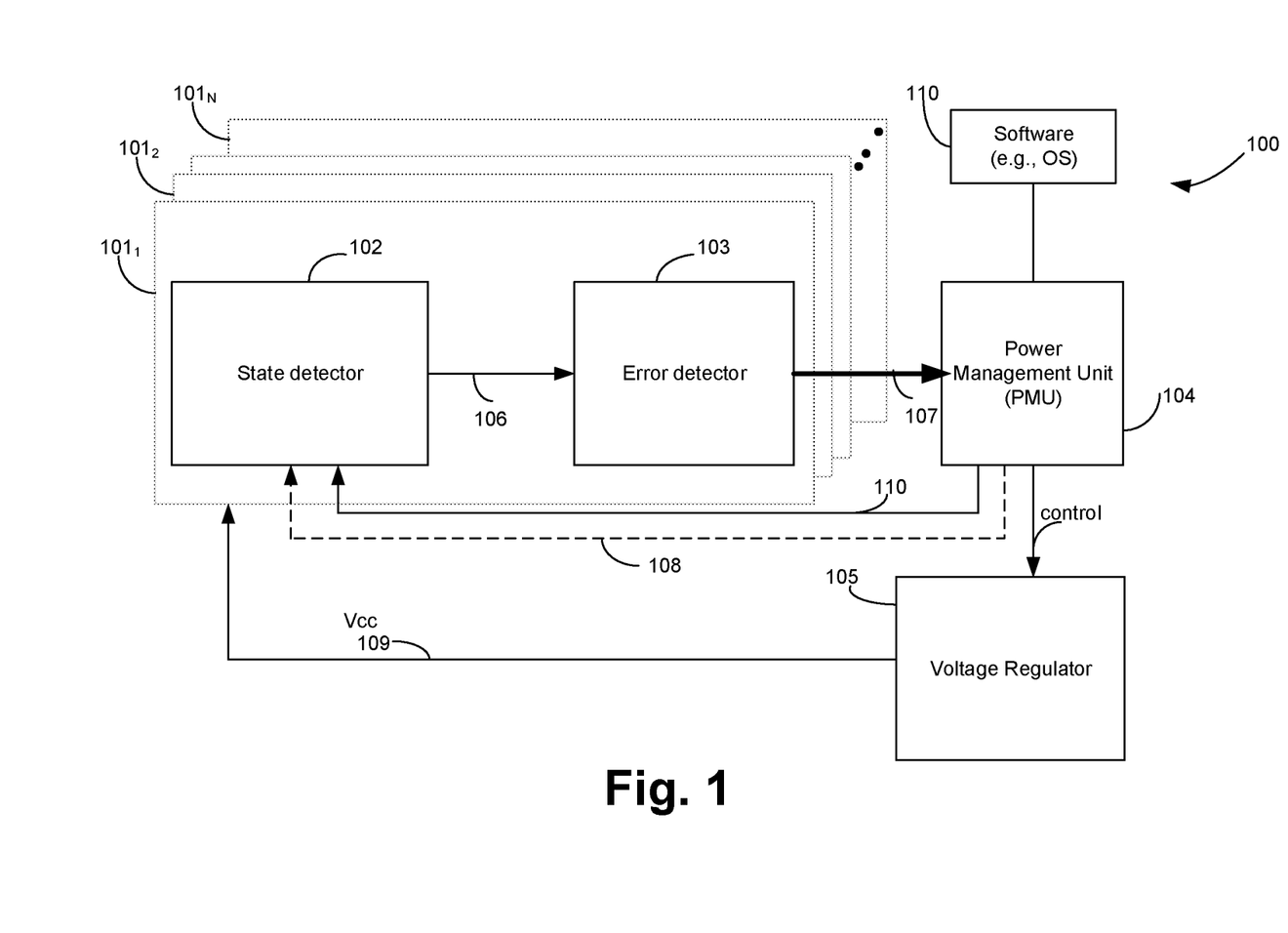
FIG. 1 illustrates a system with apparatus for $V_{min}$ detection, according to some embodiments of the disclosure.

FIG. 1 illustrates system 100 with apparatus for $V_{min}$ detection, according to some embodiments of the disclosure. In some embodiments, system 100 comprises RVD circuit 101, Power Management Unit (PMU) 104, and Voltage Regulator (VR) 105. In some embodiments, RVD circuit 101 comprises State detector 102 and Error detector 103. In some embodiments, output 106 of State detector 102 is received by Error detector 103 that analyzes output 106 and determines whether State detector 102 detected any error (e.g., loss of stored state). In some embodiments, output 107 of Error detector 103 is provided to PMU 104 which behaves like a nucleus that analyzes output 107 from one or more RVDs to determine what $V_{min}$ should be the logic circuits associated with the RVDs.

In some embodiments, system 100 includes a plurality of RVD circuits $101_{1-N}$ (where 'N' is an integer) that may be distributed across an integrated circuit (e.g., processor or system-on-chip (SOC)). For example, RVD circuits $101_{1-N}$ are placed in hot spots and other areas of the die(s) that have critical timing paths. In some embodiments, PMU 104 receives outputs 107 from RVD circuits $101_{1-N}$ and analyses them to determine if any of the RVD circuits indicate a state error (e.g., a sequential unit of a State detector 102 flipped its output). If any of the RVD circuits indicate a state error, then PMU 104 concludes that the power supply level associated with that RVD circuit has reached the $V_{min}$ floor and so the power supply should not be further reduced. For example, the power supply is set back to a level just above the established $V_{min}$ floor. In some embodiments, the RVD circuits are enabled by a pulsed clock (PCK) provided by line 110.

In some embodiments, PMU 104 issues a control signal to VR 105 to adjust the power supply $V_{cc}$ 109 to one or more RVD circuits 101. For example, depending on what the $V_{min}$ floor is established by PMU 104 according to output(s) 107, PMU 104 instructs VR 105 to adjust $V_{cc}$ 109 to that $V_{min}$ level when the processor is instructed to enter a low power mode. Request to enter a low power mode can be made by a variety of sources. For example, software 110 (e.g., operating system (OS)) may instruct PMU 104 to operate the processor at a $V_{min}$ level, and then PMU 104 analyzes output(s) 107 as $V_{cc}$ is lowered by VR 105 and determines the lowest possible $V_{min}$ to get the most power savings possible.

In some embodiments, PMU 104 controls a guard band associated with detecting a state of State detector 102. In some embodiments, PMU 104 adds or subtracts load on one or more nodes of State detector 102 via control signal 108 to adjust when State detector 102 fails to store a state for a given power supply.

Figure 2:
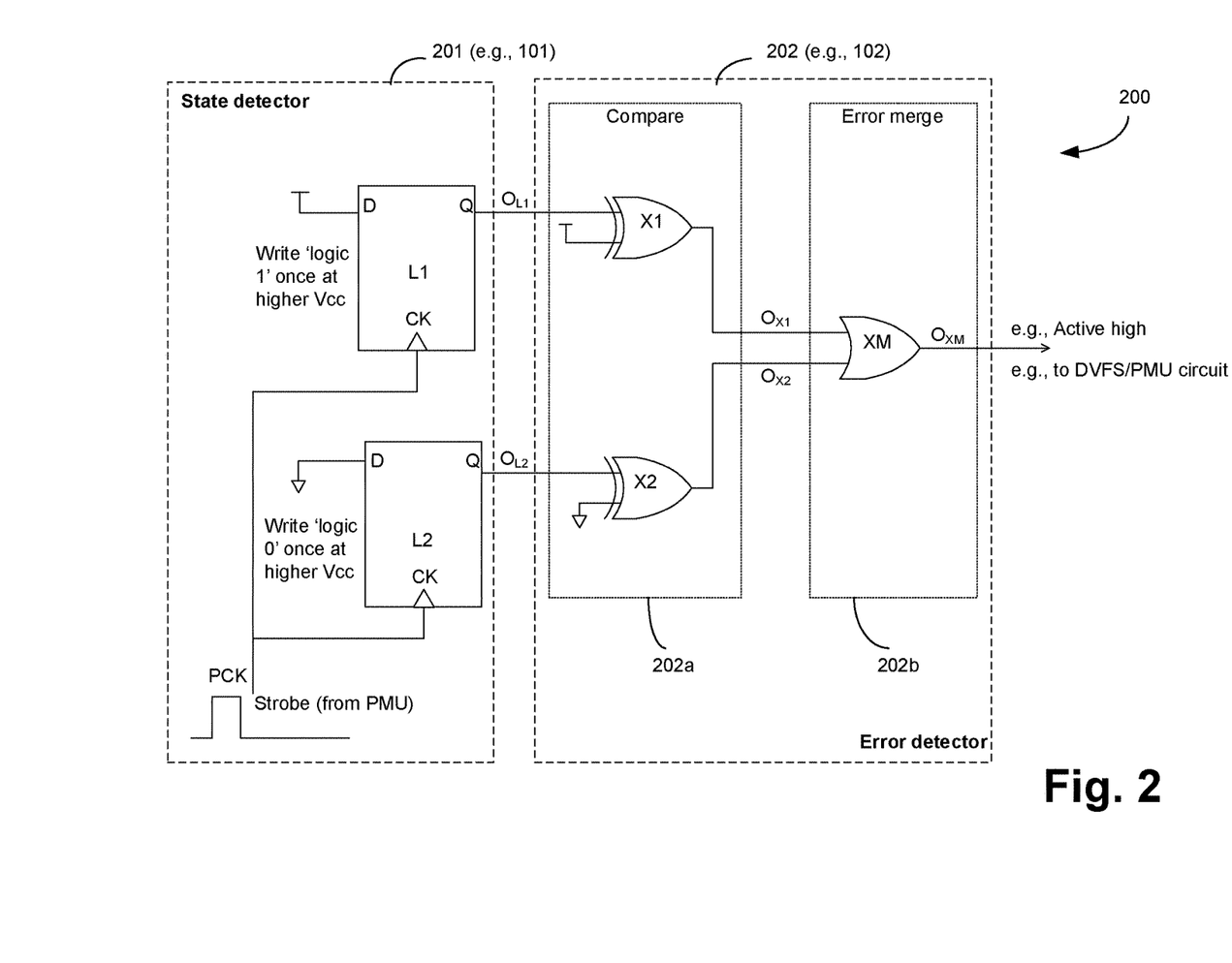
FIG. 2 illustrates a circuit level implementation of the apparatus of FIG. 1, according to some embodiments of the disclosure.

FIG. 2 illustrates a circuit level implementation 200 of the apparatus (i.e., RVD 101) of FIG. 1, according to some embodiments of the disclosure. It is pointed out that those elements of FIG. 2 having the same reference numbers (or names) as the elements of any other figure can operate or function in any manner similar to that described, but are not limited to such.

In some embodiments, RVD circuit 200/100 comprises State detector 201 and Error detector 202. In some embodiments, State detector 201 is operable to detect logic states of zero and one in response to a clock edge PCK. In some embodiments, PCK is a clock pulse generated by PMU 104 (and provided to RVDs via interconnect or line 110) to begin the process of detecting states by State detector 201. In some embodiments, Error detector 202 is coupled to State detector 201, where Error detector 202 is to detect an error in the detected logic states.

In some embodiments, State detector 201 comprises a first sequential logic L1 having a data input (D) coupled to a supply node ($V_{cc}$). In some embodiments, State detector 201 comprises a second sequential logic L2 having a data input (D) coupled to a ground node ($V_{ss}$). In some embodiments, clock inputs (i.e., CK) of the first and second sequential logics are coupled together and are to receive the clock edge of PCK. In some embodiments, the first and second sequential logics L1 and L2 include devices with the highest voltage threshold and the smallest size as available by a process technology on which they are fabricated. In some embodiments, the first and second sequential units are flip-flops. In some embodiments, the first and second sequential units are latches. In other embodiments, other types of sequential units can be used which are capable of storing a state variable (e.g., logic 1 or logic 0). One example of a sequential unit that can be used for either first or second sequential units L1 and L2 is illustrated with reference to FIG. 3.

Figure 3:
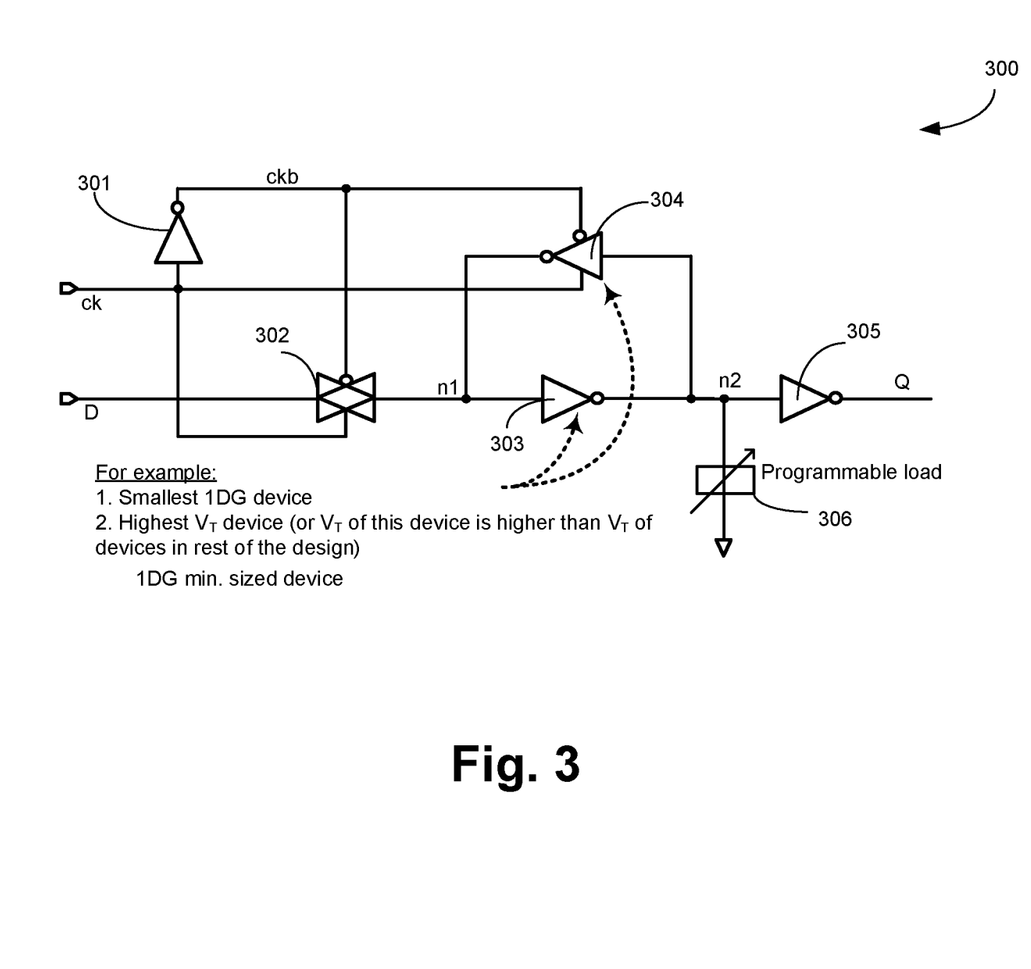
FIG. 3 illustrates a circuit implementation of a sequential unit used for detecting $V_{min}$, according to some embodiments of the disclosure.

FIG. 3 illustrates a circuit implementation of a sequential unit 300 used for detecting $V_{min}$, according to some embodiments of the disclosure. It is pointed out that those elements of FIG. 3 having the same reference numbers (or names) as the elements of any other figure can operate or function in any manner similar to that described, but are not limited to such. Sequential logic 300 is a latch.

In some embodiments, sequential unit 300 comprises input data port (D), output data port (Q), and clock point (ck). In some embodiments, sequential unit 300 comprises inverter 301, pass-gate 302, inverter 303, tri-state inverter 304, inverter 305, and programmable or tunable load 306 coupled together as shown. A person skilled in the art would appreciate that other variations of this design can be used. For example, the tri-stable inverter 305 can be replaced with a combinational logic such as a NAND gate or a NOR gate. Such variations are within the scope of the various embodiments.

In some embodiments, inverter 301 receives clock ck are generates an inverted version ckb. Here, labels for signals and nodes are interchangeably used. For example, the term "ckb" may refer to a clock signal or a node providing the clock signal, depending on the context of the sentence. In some embodiments, pass-gate 302 (or transmission gate) is controlled by clock ck and its inverse ckb. When pass-gate 302 is closed, data 'D' is coupled to node n1. In some embodiments, tristate inverter 304 and inverter 303 are connected as a memory element (also known as a keeper element). As such, logic on node n1 is different than logic on node n2. Tristate inverter 304 and inverter 303 are sensitive to power supply $V_{cc}$ and can flip when static noise margin (SNM) is violated.

In some embodiments, programmable load 306 can change the switching threshold of the memory element. In some embodiments, for sequential unit 300 to detect the $V_{min}$ floor, it is implemented with 1DG devices (e.g., with minimum W/L dimensions) and with the highest $V_T$ devices than the $V_T$ of other devices in the processor. Higher $V_T$ devices can safely predict data retention failure before it actually occurs in a design.

Referring back to FIG. 2, in some embodiments, at least one of the first and second sequential logics (L1 and L2) have a tunable load coupled to one of their nodes. In some embodiments, both first and second sequential logics (L1 and L2) have tunable loads. Tunable loads may be coupled to node n2 of the sequential unit 300. One such example of a tunable load is illustrated with reference to FIG. 4.

Figure 4:
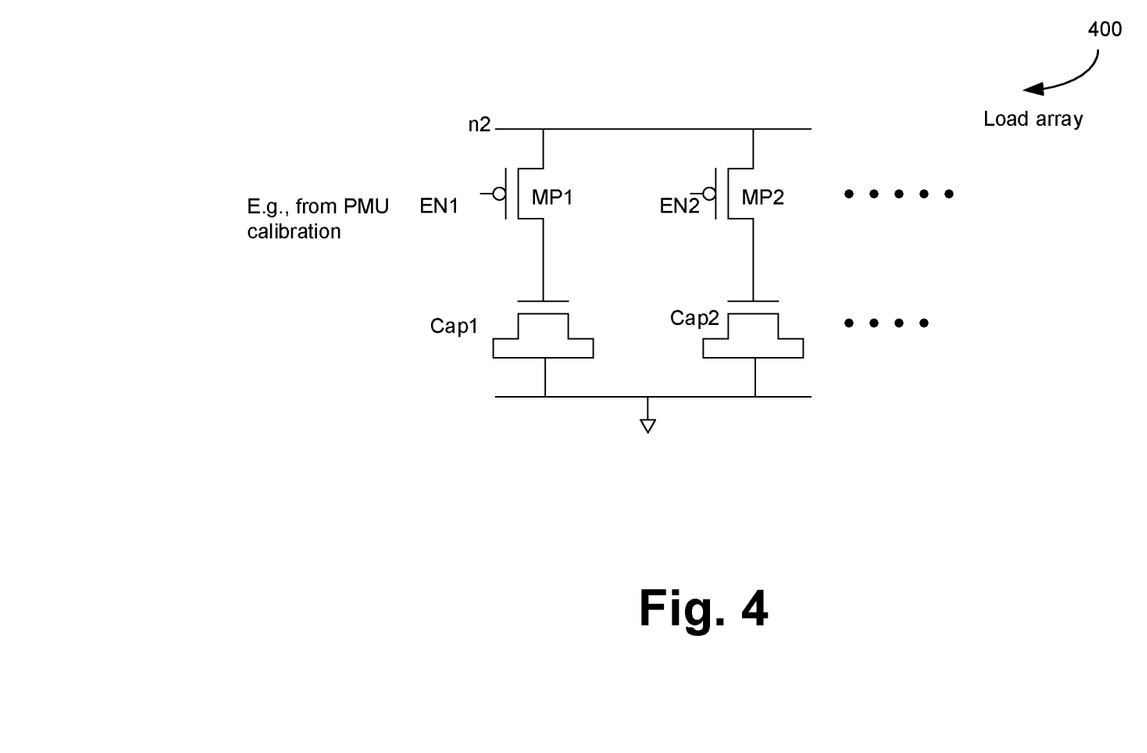
FIG. 4 illustrates a variable load for adjusting the $V_{min}$ detection threshold of the sequential unit of FIG. 3, according to some embodiments of the disclosure.

FIG. 4 illustrates a variable load 500 for adjusting the $V_{min}$ detection threshold of the sequential unit 300 of FIG. 3, according to some embodiments of the disclosure. It is pointed out that those elements of FIG. 4 having the same reference numbers (or names) as the elements of any other figure can operate or function in any manner similar to that described, but are not limited to such.

In some embodiments, variable load 400 comprises one or more switchable loads, which are coupled in parallel with each other. In some embodiments, each switchable load comprises a controllable transistor (e.g., p-type transistor) coupled in series with a capacitive device. In this example, two switchable loads are shown, where the first switchable load comprises transistor MP1 coupled in series with capacitive device Cap1, and where the second switchable load comprises transistor MP2 coupled in series with capacitive device Cap2.

Figure 5:
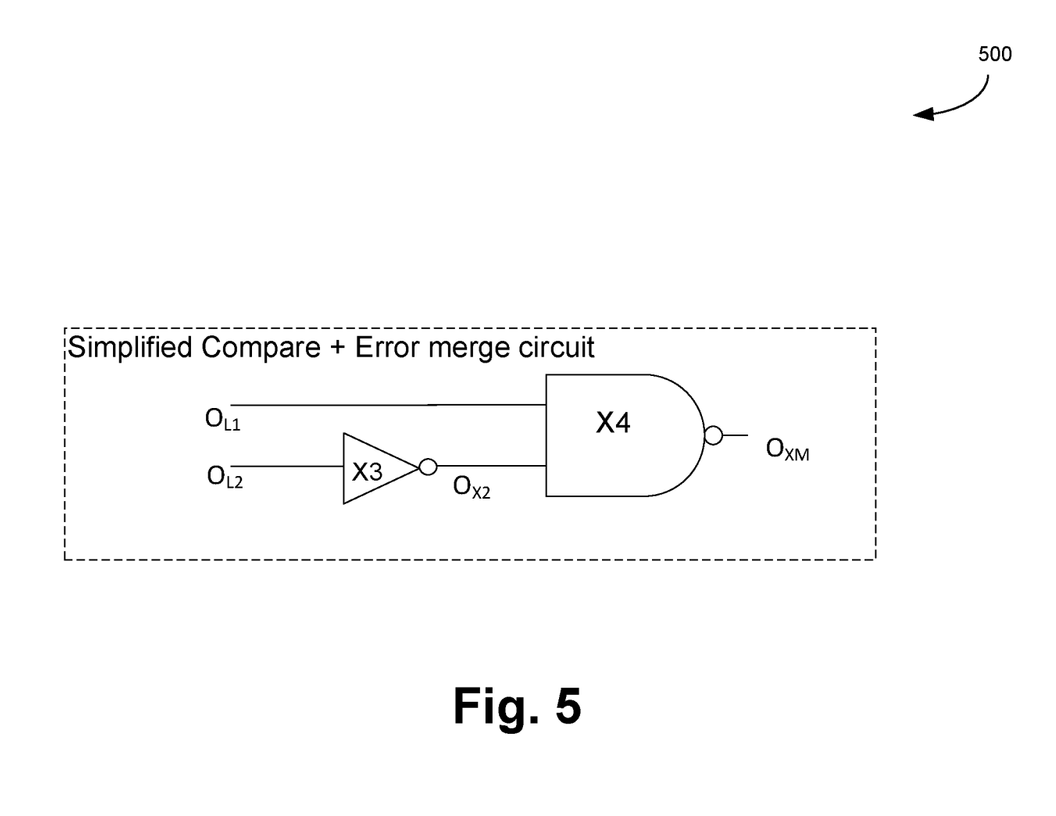
FIG. 5 illustrates a high-level logic representation of a portion of the apparatus, according to some embodiments of the disclosure.

In some embodiments, transistor MP1 is controllable by an enable signal EN1 which is provided by PMU 104 (e.g., via signal path 108). In some embodiments, transistor MP2 is controllable by an enable signal EN2 which is provided by PMU 104 (e.g., via signal path 108). In some embodiments, capacitive devices Cap1 and Cap2 are capacitors. In some embodiments, capacitive devices Cap1 and Cap2 are transistors configured as capacitors. In some embodiments, capacitive devices Cap1 and Cap2 are implemented as metal capacitors. In some embodiments, capacitive devices Cap1 and Cap2 are implemented as a hybrid of transistor and metal capacitors. While the embodiment of FIG. 5 illustrates p-type switchable transistor and n-type capacitive device, other variations can also be used. For example, the switchable transistor can be an n-type transistor while the capacitive device may be implemented as a p-type device.

Referring back to FIG. 2, in some embodiments, Error detector 202 comprises Compare logic 202a and Error merge 202b. In some embodiments, Compare logic 202a comprises a first compare logic X1 coupled to an output node $O_{L1}$ of the first sequential unit L1, where the first compare logic X1 is to compare an output on the output node $O_{L1}$ to a voltage on the supply node. In some embodiments, Compare logic 202a comprises a second compare logic X2 coupled to an output node $O_{L2}$ of the second sequential unit L2, where the second compare logic X2 is to compare an output on the output node $O_{L2}$ of the second sequential unit L2 to a voltage on the ground node. In some embodiments, the first and second compare logics are implemented as exclusive-OR (XOR) logic gates. In other embodiments, the first and second compare logics can be implemented as other types of circuits, e.g., XNOR, digital comparator, etc.

In some embodiments, Error merge logic 202b comprises an OR gate (XM) which is to merge (or sum) outputs $O_{X1}$ and $O_{X2}$ of the first and second compare logics X1 and X2, respectively. In some embodiments, Error merge logic 202b is implemented as a NOR gate. In some embodiments, the output $O_{XM}$ of error merge logic 202b is an active high signal. In some embodiments, the output $O_{XM}$ is buffered and provided to PMU 104. FIG. 5 illustrates a high-level logic representation 500 of a portion Error detector 202, according to some embodiments of the disclosure. Logic 500 is a simplification of Error detector 202 using Karnaugh map simplification. Here, outputs from the first and second sequential units L1 and L2 are provided to a NAND gate X3 such that the output of the second sequential unit L2 is inverted before it is received by NAND gate X3. In this example, inverter X2 inverts output $O_{L0}$ to $O_{x2}$, and $O_{X2}$ is provided as input to NAND gate X3. In some embodiments, instead of NAND gate and equivalent NOR gate implementation is used for Error detector 202.

In some embodiments, RVD circuit 200 operates on the same voltage rail ($V_{cc}$) as the logic where it is located or positioned. In some embodiments, RVD circuit 200 has a dual, independent logic 1 or logic 0 sequential units for checking data retention flips. RVD circuit 200 may be placed in hot spots or other problem areas of a die which is expected to suffer from higher stress (e.g., higher current and aging), according to some embodiments. For example, RVD circuit 200 may be placed next to a thermal sensor which detects temperature of a hot spot. In some embodiments, the write 1 and write 0 sequential units are shown as L1 and L2 with data inputs preloaded using a one-shot strobe (PCK) from the PMU 104 at safe, higher $V_{cc}$.

In some embodiments, RVD circuit 200 is designed to ensure that it consistently predicts data retention failure, before it actually occurs in the design. In some embodiments, when programmable load 306 is enabled, additional capacitive load is placed on the keeper node n2, worsening the SNM and allowing for better silicon-specific tuning of the $V_{min}$ floor. Table 1 illustrates normalized $V_{min}$ data retention values (and $V_{cc}$ margin) for sequential units L1 and L2 in the presence of process device variations (e.g., five sigma (5σ)). Here $V_{T3}$ is greater than $V_{T2}$, and $V_{T2}$ is greater than $V_{T1}$.

TABLE 1

| Type | 2DG (mV) | 1DG (mV) | Margin for 1DG Vs 2DG (mV) |
|---|---|---|---|
| $V_{T1}$ | 0.45 | 0.50 | 50 |
| $V_{T2}$ | 0.48 | 0.52 | 40 |
| $V_{T3}$ | 0.52 | 0.58 | 60 |

In some embodiments, the specific sizing of keeper elements (e.g., inverter 303 and tristate inverter 304) can be adjusted based on general design guidelines. For example, some designs may use 2DG minimum, allowing a 1DG-based RVD circuit to function as a $V_{min}$ data retention circuit, providing sufficient voltage headroom (example: 40-60 mV). Here, 2DG means devices drawn on one grid larger than the minimum allowable grid. In another example, the RVD circuit can be built using one (or two) logic devices with $V_T$ higher than the threshold voltage ($V_T$) used for the design, allowing for sufficient safe failure margin. In some embodiments, the RVD circuit can also signal potential $V_{min}$ data failure in the presence of excessive $V_{cc}$ droops, as might happen during a wake during power ON or from a power-gating event. A person skilled in the art would appreciate that there are a variety of ways to increase $V_T$ (e.g., bulk or substrate biasing) and all or any of such techniques can be used with the various embodiments to change the $V_T$ of the devices.

In some embodiments, multiple instances of RVD circuit 200 are placed across the die. In some embodiments, PMU 104 receives multiple error signals from RVDs (e.g., $O_{XM1}$ ... $O_{XMn}$) and sets the logic $V_{cc}$ floor based on the error from the RVD circuit operating at the highest $V_{cc}$.

Figure 6A:
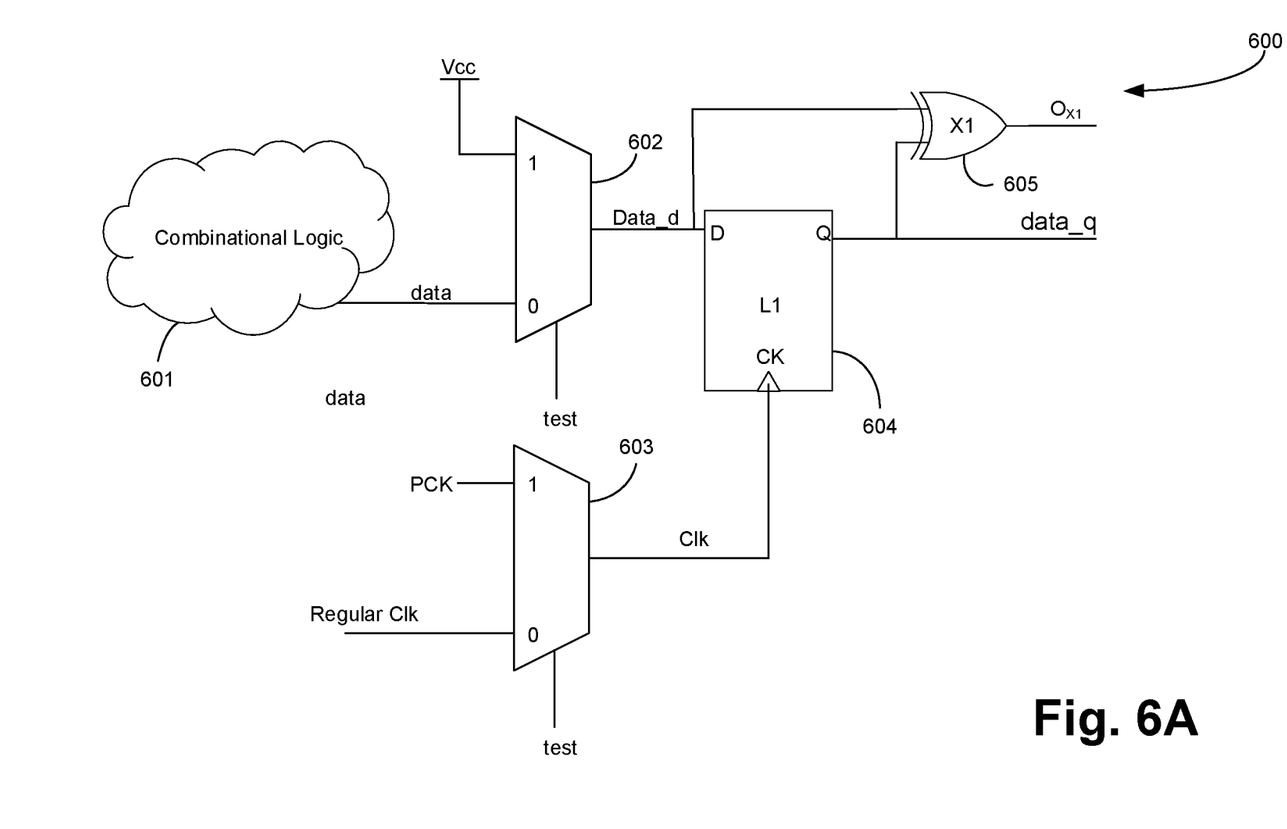
FIGS. 6A-B illustrate apparatuses for $V_{min}$ detection which are integrated within a logic data path, according to some embodiments of the disclosure.
Figure 6B:
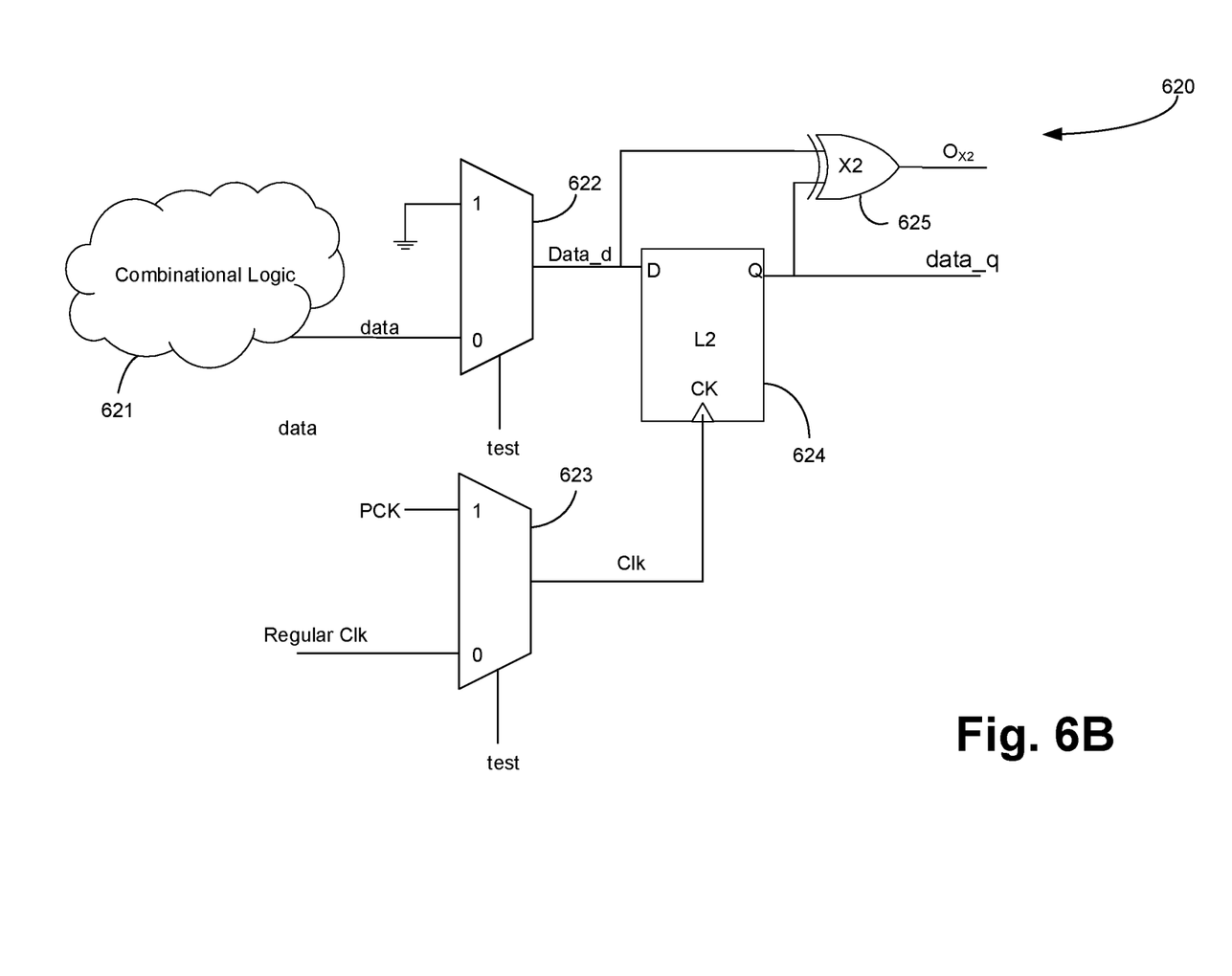

FIGS. 6A-B illustrate apparatuses 600 and 620, respectively, for $V_{min}$ detection which are integrated within a logic data path, according to some embodiments of the disclosure. It is pointed out that those elements of FIGS. 6A-B having the same reference numbers (or names) as the elements of any other figure can operate or function in any manner similar to that described, but are not limited to such.

In some embodiments, in addition to or instead of having dedicated RVD circuits 101, the RVD function can be integrated in known data paths that are known to have critical timing. One such integrated RVD function is illustrated with reference to FIG. 6A. In some embodiments, data from combinational logic 601 is selectively provided by multiplexer 602 to sequential unit L1 604 during a non-test mode (or normal mode). For example, when the test select signal to first multiplexer 602 is low, data is provided to node Data_d, which is coupled to the data input of sequential 604. In some embodiments, when the test select signal is high, test mode is enabled and $V_{cc}$ is coupled to node Data_d. During test mode, PCK is also provided to the clock port of sequential unit 604.

As such, in some embodiments, a second multiplexer 603 is provided which can selectively provide one of PCK or Regular clock (Clk) to node Clk according to the logic level of the test select signal. For example, when the test select signal to second multiplexer 603 is low, Regular Clk is provided to node Clk, which is coupled to the clock port of sequential 604. In some embodiments, when the test select signal is high, test mode is enabled and PCK is coupled to node Clk. In some embodiments, the error detection is performed by compare logic X1 605. In some embodiments, XOR logic 605 is implemented as an XOR gate with inputs coupled to the input (Data_d) and output (data_q) of sequential unit 604. In some embodiments, the output $O_{X1}$ of XOR gate 605 is merged with other such outputs from other RVDs and the summed or merged output is provided to PMU 104.

The implementation of FIG. 6B is similar to FIG. 6A except that instead of writing a logic 1 into sequential unit during the test mode, a logic 0 is written into the sequential unit.

In some embodiments, data from combinational logic 621 is selectively provided by multiplexer 622 to sequential unit L1 624 during a non-test mode (or normal mode). For example, when the test select signal to first multiplexer 622 is low, data is provided to node Data_d, which is coupled to the data input of sequential 624. In some embodiments, when the test select signal is high, test mode is enabled and ground is coupled to node Data_d. During test mode, PCK is also provided to the clock port of sequential unit 624.

As such, in some embodiments, a second multiplexer 623 is provided which can selectively provide one of PCK or Regular clock (Clk) to node Clk according to the logic level of the test select signal. For example, when the test select signal to second multiplexer 623 is low, Regular Clk is provided to node Clk, which is coupled to the clock port of sequential 624. In some embodiments, when the test select signal is high, test mode is enabled and PCK is coupled to node Clk. In some embodiments, the error detection is performed by compare logic X2 625. In some embodiments, XOR logic 625 is implemented as an XOR gate with inputs coupled to the input (Data_d) and output (data_q) of sequential unit 624. In some embodiments, the output $O_{X2}$ of XOR gate 625 is merged with other such outputs from other RVDs and the summed or merged output is provided to PMU 104 for analysis.

Figure 7:
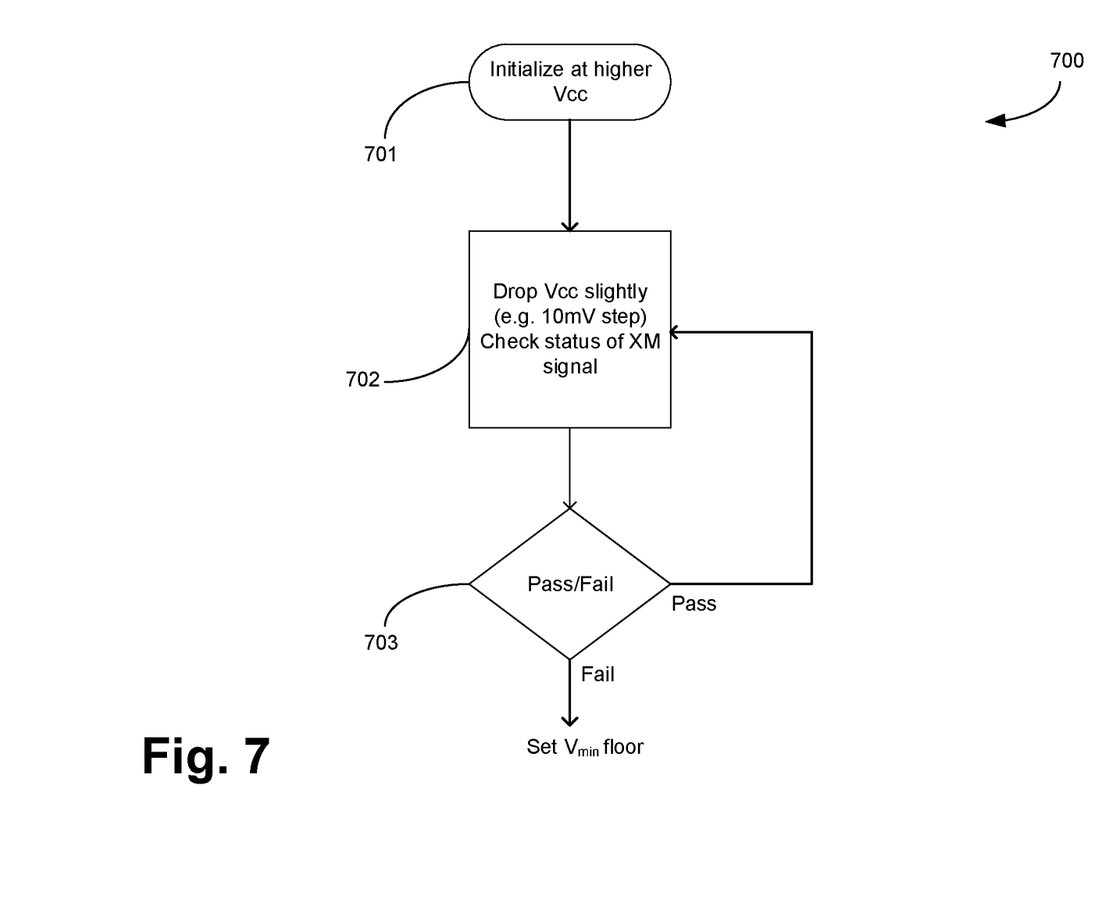
FIG. 7 illustrates a flowchart of a method for detecting $V_{min}$, according to some embodiments of the disclosure.

FIG. 7 illustrates flowchart 700 of a method for detecting $V_{min}$, according to some embodiments of the disclosure. It is pointed out that those elements of FIG. 7 having the same reference numbers (or names) as the elements of any other figure can operate or function in any manner similar to that described, but are not limited to such.

Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 701, PMU 104 first initializes multiple RVDs (e.g., $101_{1-N}$) on the die using a pulse/strobe signal (PCK), initially at higher $V_{cc}$. At block 702, PMU 104 adjusts the $V_{cc}$ downward in finite steps (e.g., 10 mV) as part of the DVFS scheme. At block 702, PMU 104 continuously samples/monitors the error (e.g., Pass/Fail) signals from RVDs (e.g., signals $O_{XM1}$ ... $O_{XMn}$) and sets the logic $V_{cc}$ floor based on the first error occurrence from any of the RVD instantiations. In some embodiments, the priority logic in PMU 104 (e.g., MAX $V_{min}(O_{XM1} \ldots O_{XMn})$) ensures that the worst-case (e.g., highest $V_{min}$) for data retention is selected for the $V_{min}$ floor and prevents further $V_{cc}$ reduction as part of DVFS mechanism.

Figure 8:
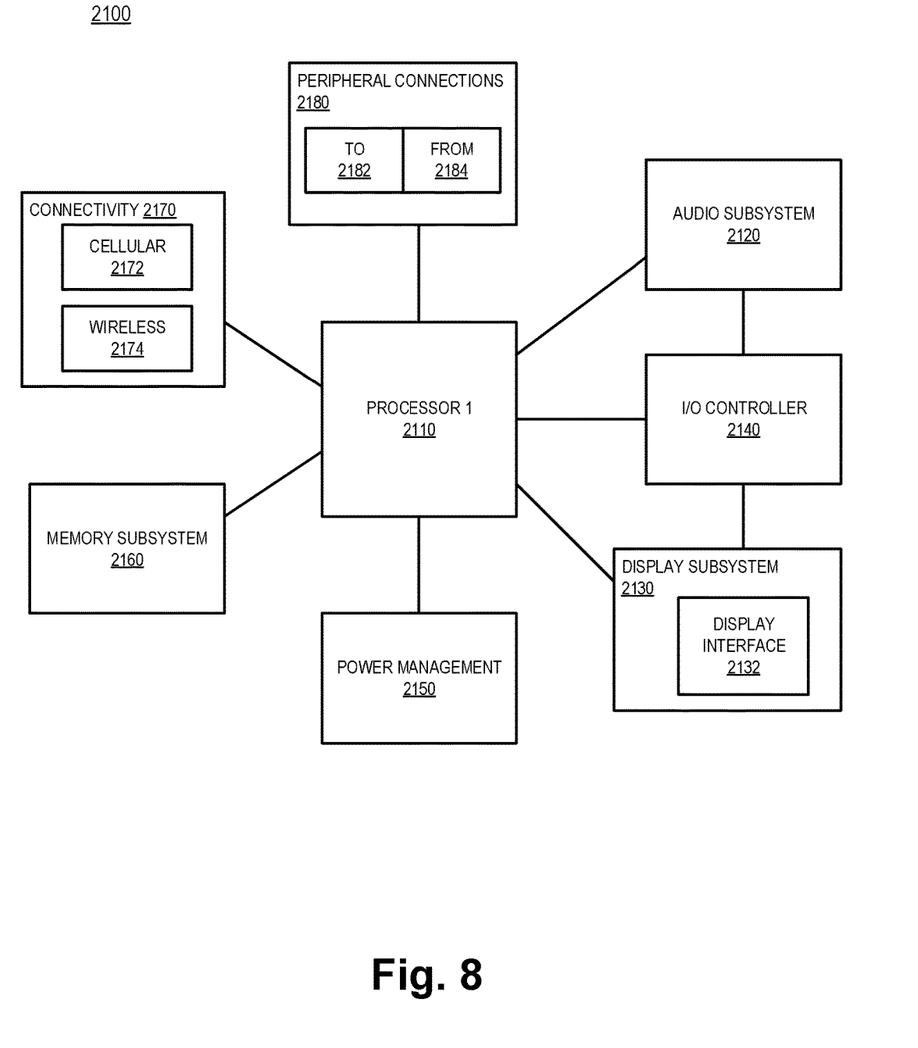
FIG. 8 illustrates a smart device or a computer system or a SoC (System-on-Chip) having the apparatus for $V_{min}$ detection, according to some embodiments.

FIG. 8 illustrates a smart device or a computer system or a SoC (System-on-Chip) having the apparatus for $V_{min}$ detection, according to some embodiments. It is pointed out that those elements of FIG. 8 having the same reference numbers (or names) as the elements of any other figure can operate or function in any manner similar to that described, but are not limited to such. FIG. 8 illustrates a block diagram of an embodiment of a mobile device in which flat surface interface connectors could be used.

In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100. In some embodiments, one or more blocks of SOC 2100 includes the apparatus for $V_{min}$ detection.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The various embodiments of the present disclosure may also comprise a network interface within 2170 such as a wireless interface so that a system embodiment may be incorporated into a wireless device, for example, cell phone or personal digital assistant.

The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a state detector which is operable to detect logic states of zero and one in response to a clock edge; and an error detector coupled to the state detector, wherein the error detector is to detect an error in the detected logic states. In some embodiments, the apparatus comprises a power management unit (PMU) to receive an output of the error detector and to adjust a power supply level according to the output of the error detector.

In some embodiments, the apparatus comprises: a voltage regulator coupled to the PMU, wherein the voltage regulator is to adjust the power supply level according to an instruction from the PMU. In some embodiments, the state detector comprises: a first sequential logic having a data input coupled to a supply node; and a second sequential logic having a data input coupled to a ground node, wherein clock inputs of the first and second sequential logics are coupled together and are to receive the clock edge.

In some embodiments, at least one of the first and second sequential logics have a tunable load coupled to one of their nodes. In some embodiments, the tunable load comprises one or more switching devices coupled to one or more capacitive loads. In some embodiments, the first and second sequential logics include devices with highest voltage threshold and smallest size as available by a process technology on which they are based.

In some embodiments, the error detector comprises: a first compare logic coupled to an output node of the first sequential unit, wherein the first compare logic is to compare an output on the output node to a voltage on the supply node; and a second compare logic coupled to an output node of the second sequential unit, wherein the second compare logic is to compare an output on the output node of the second sequential unit to a voltage on the ground node. In some embodiments, the error detector comprises a merge logic to merge outputs of the first and second compare logic. In some embodiments, the apparatus comprises a power management unit (PMU) to which is to receive an output of the merge logic.

In another example, an apparatus is provided which comprises: a combinational logic to provide a data on a data node; a first multiplexer coupled to the data node and one of a supply node or a ground node, the first multiplexer having an output node; a sequential logic having a data input, an output node, and a clock input, wherein the output node of the first multiplexer is coupled to the data input; and a compare logic having a first input coupled to the data input, and a second input coupled to the output of the sequential logic, wherein the compare logic is to detect a $V_{min}$ threshold of the sequential logic during a test mode.

In some embodiments, the apparatus a second multiplexer coupled to a test clock node and a regular clock node, wherein the second multiplexer has an output coupled to the clock input of the sequential logic. In some embodiments, the second multiplexer is to provide a test clock on the test clock node to the clock input during the test mode. In some embodiments, the second multiplexer is to provide a regular clock on the regular clock node to the clock input during a normal mode or non-test mode. In some embodiments, the sequential logic has a tunable load coupled to one of its nodes. In some embodiments, the compare logic is an exclusive-OR gate.

In another example, a system is provided which comprises: a memory; a processor coupled to the memory, the processor having a $V_{min}$ detector which comprises: a state detector which is operable to detect logic states of zero and one in response to a clock edge; and an error detector coupled to the state detector, wherein the error detector is to detect an error in the detected logic states; and a wireless interface for allowing the processor to communicate with another device.

In some embodiments, the processor comprises a power management unit which is communicatively coupled to the error detector. In some embodiments, the processor comprises a voltage regulator which is operable to adjust a power supply level according to the detected error. In some embodiments, the state detector comprises: a first sequential logic having a data input coupled to a supply node; and a second sequential logic having a data input coupled to a ground node, wherein clock inputs of the first and second sequential logics are coupled together and are to receive the clock edge.

In some embodiments, at least one of the first and second sequential logics have a tunable load coupled to one of their nodes. In some embodiments, the tunable load comprises one or more switching devices coupled to one or more capacitive loads. In some embodiments, the first and second sequential logics include devices with highest voltage threshold and smallest size as available by a process technology on which they are based. In some embodiments, the error detector comprises: a first compare logic coupled to an output node of the first sequential unit, wherein the first compare logic is to compare an output on the output node to a voltage on the supply node; and a second compare logic coupled to an output node of the second sequential unit, wherein the second compare logic is to compare an output on the output node of the second sequential unit to a voltage on the ground node. In some embodiments, the error detector comprises a merge logic to merge outputs of the first and second compare logic. In some embodiments, the processor comprises a power management unit (PMU) to which is to receive an output of the merge logic.

In another example, a system is provided which comprises: a memory; a processor coupled to the memory, the processor having an apparatus according to the apparatus described above; and a wireless interface for allowing the processor to communicate with another device.

In another example, a method is provided which comprises: initializing power supply to a first power supply level; reducing the first power supply level to a second power supply level; and monitoring an output of a compare logic to determine whether one or more state storing circuits have lost their retained data. In some embodiments, the method comprises: reducing the second power supply level to a third power supply level; and monitoring the output of the compare logic to determine whether one or more state storing circuits have lost their retained data.

In another example, an apparatus is provided which comprises: means for initializing power supply to a first power supply level; means for reducing the first power supply level to a second power supply level; and means for monitoring an output of a compare logic to determine whether one or more state storing circuits have lost their retained data. In some embodiments, the apparatus comprises: means for reducing the second power supply level to a third power supply level; and means for monitoring the output of the compare logic to determine whether one or more state storing circuits have lost their retained data.

In another example, a system is provided which comprises: a memory; a processor coupled to the memory, the processor having an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a combinational logic to provide a data on a data node;
a multiplexer coupled to the data node and one of a supply node or a ground node, the multiplexer having an output node;
a sequential logic having a data input, an output, and a clock input, wherein the output node of the multiplexer is coupled to the data input; and
a compare logic having a first input coupled to the data input, and a second input coupled to the output of the sequential logic, wherein the compare logic is to detect a $V_{min}$ threshold of the sequential logic during a test mode.

2. The apparatus of claim 1, wherein the multiplexer is a first multiplexer, wherein the apparatus comprises a second multiplexer coupled to a test clock node and a regular clock node, and wherein the second multiplexer has an output coupled to the clock input of the sequential logic.

3. The apparatus of claim 2, wherein the second multiplexer is to provide a test clock on the test clock node to the clock input during the test mode.

4. The apparatus of claim 2, wherein the second multiplexer is to provide a regular clock on the regular clock node to the clock input during a normal mode or a non-test mode.

5. The apparatus of claim 1, wherein the sequential logic has a tunable load coupled to one of its nodes.

6. The apparatus of claim 1, wherein the compare logic comprises an exclusive-OR gate.

7. The apparatus of claim 2, wherein the first and second multiplexers are controllable by signal indicating the test mode.

8. The apparatus of claim 1, wherein the data node of the combinational logic is coupled to a first input of the multiplexer, and wherein the multiplexer has a second input coupled to one of a power supply node or a ground node.

9. The apparatus of claim 1, wherein the combinational logic is a first combinational logic, wherein multiplexer is a first multiplexer, wherein the sequential logic is a first sequential logic, wherein the compare logic is a first compare logic, wherein the apparatus comprises:

a second combinational logic to provide a second data on a second data node;

a third multiplexer coupled to the second data node and one of the supply node or the ground node, the third multiplexer having an output node;

a second sequential logic having a data input, an output, and a clock input, wherein the output node of the third multiplexer is coupled to the data input; and a second compare logic having a first input coupled to the data input, and a second input coupled to the output of the second sequential logic, wherein the second compare logic is to detect a $V_{min}$ threshold of the sequential logic during the test mode.

10. The apparatus of claim 9 comprises a summer to sum outputs of the first and second compare logics.

11. The apparatus of claim 10 comprises a power management unit to receive an output of the summer.

12. The apparatus of claim 9, wherein outputs of the first and second compare logics are merged by a merging circuitry to generate a merged output.

13. The apparatus of claim 12, comprises a power management unit to receive the merged output.

14. The apparatus of claim 12, wherein the merging circuitry comprise a OR gate.

15. An apparatus comprising:
a logic to provide a data on a data node;
a selector coupled to the data node and one of a supply node or a ground node, the selector having an output node;
a flip-flop having a data input, an output, and a clock input, wherein the output node of the selector is coupled to the data input; and
a comparator having a first input coupled to the data input, and a second input coupled to the output of the sequential logic.

16. The apparatus of claim 15, wherein the selector is a first selector, wherein the apparatus comprises a second selector coupled to a test clock node and a regular clock node, and wherein the second selector has an output coupled to the clock input of the flip-flop.

17. The apparatus of claim 15, wherein the comparator comprises one of:
an exclusive-OR (XOR) gate; or
an exclusive-NOR (XNOR) gate.

18. The apparatus of claim 16, wherein the second selector is to provide a test clock on the test clock node to the clock input during the test mode.

19. A system comprising:
a memory,
a processor coupled to the memory, the processor including a Vmin retention detector apparatus which comprises:
a logic to provide a data on a data node;
a selector coupled to the data node and one of a supply node or a ground node, the selector having an output node;
a flip-flop having a data input, an output, and a clock input, wherein the output node of the selector is coupled to the data input; and
a comparator having a first input coupled to the data input, and a second input coupled to the output of the sequential logic; and
a wireless interface to allow the processor to communicate with another device.

20. The system of claim 19, wherein the selector is a first selector, wherein the apparatus comprises a second selector coupled to a test clock node and a regular clock node, and wherein the second selector has an output coupled to the clock input of the flip-flop.

* * * * *